(12) United States Patent
Oba et al.

(10) Patent No.: US 6,343,498 B1
(45) Date of Patent: Feb. 5, 2002

(54) PHYSICAL QUANTITY SENSOR HAVING FAULT DETECTION FUNCTION

(75) Inventors: Nobukazu Oba, Chiryu; Makoto Hatanaka, Handa; Yoshifumi Murakami, Tokai, all of (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/686,000

(22) Filed: Oct. 12, 2000

(30) Foreign Application Priority Data

Oct. 29, 1999 (JP) .......................................... 11-309595
Dec. 24, 1999 (JP) .......................................... 11-366460

(51) Int. Cl.[7] .............................................. G01R 31/02
(52) U.S. Cl. ...................................................... 73/1.57
(58) Field of Search .................................. 73/1.01, 1.08, 73/1.57, 1.73; 324/537, 763

(56) References Cited

U.S. PATENT DOCUMENTS 4,853,629 A * 8/1989 Rops
4,878,107 A * 10/1989 Hopper
5,142,235 A * 8/1992 Matsumoto et al.
5,631,602 A 5/1997 Kearney et al.

FOREIGN PATENT DOCUMENTS

| JP | 5-52680 | 2/1993 |
| JP | 6-58989 | 4/1994 |
| JP | 6-347317 | 12/1994 |
| JP | 9-88708 | 3/1997 |

* cited by examiner

Primary Examiner—Robert Raevis
(74) Attorney, Agent, or Firm—Law Office of David G. Poss

(57) ABSTRACT

A sensor apparatus which can accurately detect a fault due to poor connection or the like at a connection portion between a sensor portion and a control portion. The sensor apparatus is provided with a sensor portion and a control portion which is electrically connected to the sensor portion via a power supply line, an output line and a ground line. The control portion includes a switch and the diagnosis circuit. The switch switches the power supply to the sensor portion to one of the power supply line and the output line. When the power is supplied to the output line, the diagnosis circuit measures current flowing from the output line to the ground line, and detects the fault by comparing the measured current with a reference voltage value.

14 Claims, 7 Drawing Sheets

US 6,343,498 B1

PHYSICAL QUANTITY SENSOR HAVING FAULT DETECTION FUNCTION

CROSS REFERENCE TO RELATED APPLICATION

This application is based upon Japanese Patent Application Nos. Hei. 11-309595 filed on Oct. 29, 1999, and Hei. 11-366460 filed on Dec. 24, 1999, the contents of which are incorporated herein by reference.

BACKGROUND OF THE INVENTION

1. Field of the Invention

This invention relates to physical quantity sensors, and particular to a physical quantity sensor having a diagnosis function, and more particular to a physical quantity sensor for detecting physical quantity such as pressure and having a diagnosis function.

2. Related Art

A related art sensor apparatus, which is used for detecting pressure in a vehicle such as brake fluid pressure or fuel pressure, will be explained with reference to FIG. 10. This kind of sensor apparatus is provided with a sensor portion 20 for outputting signals depending on pressure applied thereon and a control portion 10 such as an ECU for performing several controls based on the output signal from the sensor portion 20.

A battery power supply Vcc (e.g., 12V) is converted to a constant voltage (e.g., 5V) by a regulator 11 provided in the control portion 10. After being converted, the battery power supply is supplied to the sensor portion 20 via a power supply line $L_P$. The sensor portion 20 performs several functions including a pressure detection, an output amplify, and an adjusting the output by using the supplied constant voltage as power. The sensor portion 20 also outputs output voltage Vo in proportion to applied pressure through an output line $L_O$. The control portion 10 performs several controls based on the output voltage Vo.

It is necessary to electrically connect between the control portion 10 and the sensor portion 20 via the power supply line $L_P$, the output line $L_O$ and a ground line $L_G$. Generally, the control portion 10 and the sensor portion 20 are electrically connected by using a connector, soldering, welding or the like. Here, in FIG. 10, terminals of the control portion 10 which connecting each line $L_P$, $L_O$, $L_G$ are described as PE, OE, GE; and terminals of the sensor portion 20 which connecting each line $L_P$, $L_O$, $L_G$ are described as PS, OS, GS.

However, a poor connection (failure in connection) at a connection point between the control portion 10 and the sensor portion 20 may cause a fault due to an increase of a resistance of the line. Particularly, when such a fault occurs on the output line $L_O$, an additional resistor Rx is added to the connection point. In this case, the output voltage Vo will fluctuate by $\Delta$Vo (=Io×Rx) depending on a current Io in the output line $L_O$. Therefore, when the output voltage Vo from the sensor portion 20 changes, it is difficult to distinguish whether this change is caused due to pressure changes or due to poor connection.

Here, it assumes that a fault due to the poor connection is detected by measuring the output voltage Vo while no pressure is applied to the sensor portion. For example, when a load resistor R having 330 kΩ is provided between the output line $L_O$ and the ground line $L_G$, and the output voltage while no pressure is applied to the sensor portion is Vo=0.5 V, the current Io in the output line $L_O$ is Io=1.5 μA.

Here, a standard output voltage Vo is set to, for example, 0.1 V. A diagnosis system is constructed to detect the fault of the pressure sensor when the output voltage excesses a range of Vo=0.5±0.1 V. In this case, when the resistance is increased by Rx due to the poor connection or the like, the diagnosis system cannot detect the increase of the resistance if the resistance increases by Rx=66 kΩ (=0.1 V×1.5 μA) or less. Here, the tolerance standard ±0.1 V is determined by considering manufacturing deviation of the pressure sensor, and it is difficult to reduce this standard because it causes decrease of productivity of the sensors and it causes increase of manufacturing cost.

Incidentally, in general, the control portion 10 is provided with a load resistor RA between the output line $L_O$ and the ground line $L_G$, so that the sensor output (normally within a range of 0.5 V–4.5 V) is positively changed into a fault signal (outside of the normal range, e.g., 4.8 V or more, or 0.2 V or less) when a short-circuit or a cut-off occurs on the lines $L_P$, $L_O$ and $L_G$. Therefore, the sensor output $V_{OE}$ to be received by the control portion 10 is determined by a resistance division between the load resistor RA and the increased resistance Rx. In detail, the $V_O$, is calculated by $V_{OE}=V_{OS}\times RA/(RA+Rx)$.

For example, when the load resistor is PL=100 kΩ and the sensor output from the sensor portion is $V_{OS}$=0.5 V, as shown in FIG. 11, the sensor output $V_{OE}$ received by the control portion 10 changes in response to the resistance Rx added to the output line $L_O$, and the sensor output deviates from the $V_{OS}$ which is outputted from the sensor portion 20. Therefore, even when the sensor portion 20 outputs accurate sensor signal $V_{OS}$ in response to the applied pressure, the control portion 10 performs several controls based on the sensor signal $V_{OE}$ which is different from the sensor signal $V_{OS}$ outputted from the sensor portion 20.

SUMMARY OF THE INVENTION

This invention has been conceived in view of the background thus far described and its object is to accurately detect a fault due to poor connection or the like at a connection portion between a sensor portion and a control portion.

According to a first aspect of the present invention, a diagnosis portion measures current flowing in one of external wirings to detect a resistance of a circuit system including the one of the external wirings in which the current flows. Then, the diagnosis portion detects a fault of the circuit system by processing measured current. Therefore, when the resistance is changed as a result of the fault such as a poor connection, such the fault can be easily detected.

According to a second aspect of the present invention, a diagnosis portion measures current flowing from the output line to the ground line. Then, the diagnosis portion detects an occurrence of fault by comparing a measured current value and a predetermined reference current value. Therefore, when the resistance is changed as a result of the fault such as a poor connection, such the fault can be easily detected.

According to a third aspect of the present invention, a diagnosis portion detects a difference between the sensor signal before changing the current and the sensor signal after changing the current.

The diagnosis portion detects an occurrence of fault based on the difference in the sensor signal. Therefore, when the resistance is changed as a result of the fault such as a poor connection, such the fault can be easily detected.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

First embodiment

Figure 1:
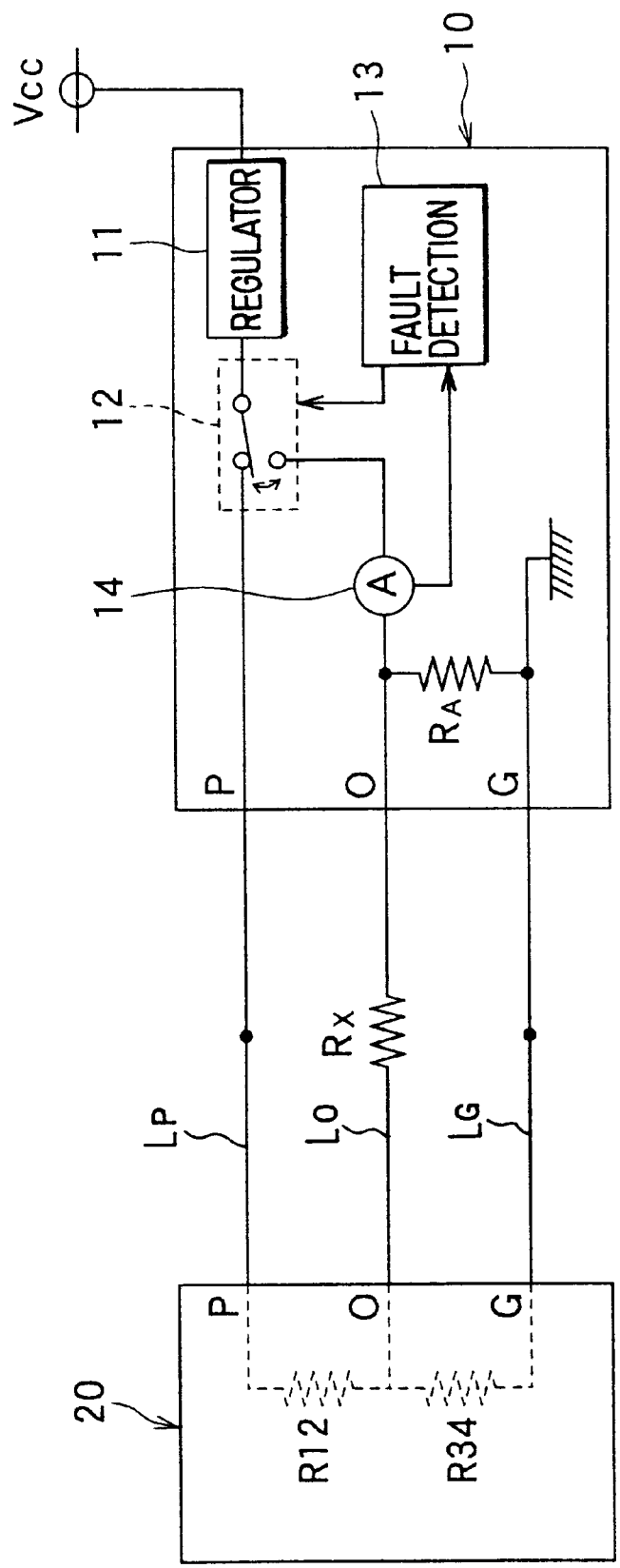
FIG. 1 is a schematic circuit configuration of a sensor apparatus of a first embodiment according to the present invention.
Figure 3:
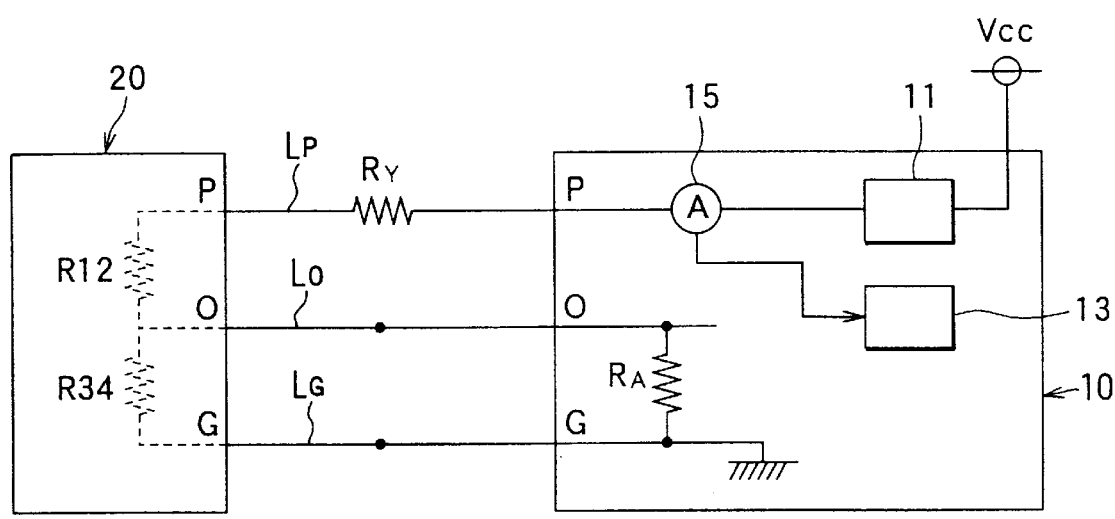
FIG. 3 is a schematic circuit configuration of a sensor apparatus of a second embodiment according to the present invention.
Figure 10:
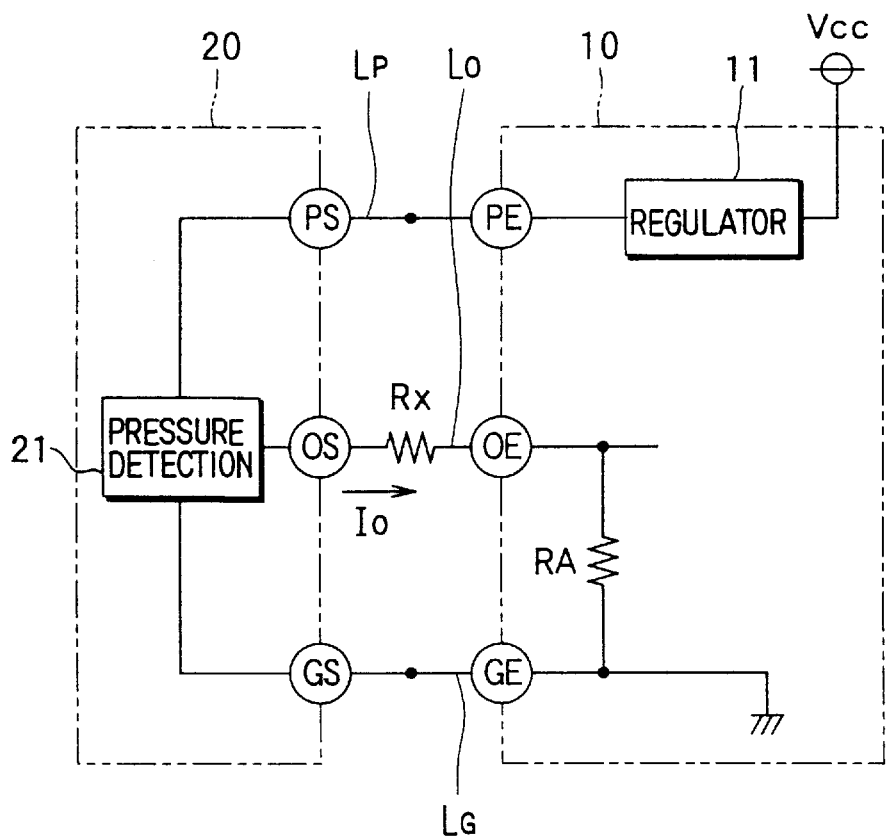
FIG. 10 is a schematic circuit configuration of a pressure sensor apparatus according to a related art.
Figure 11:
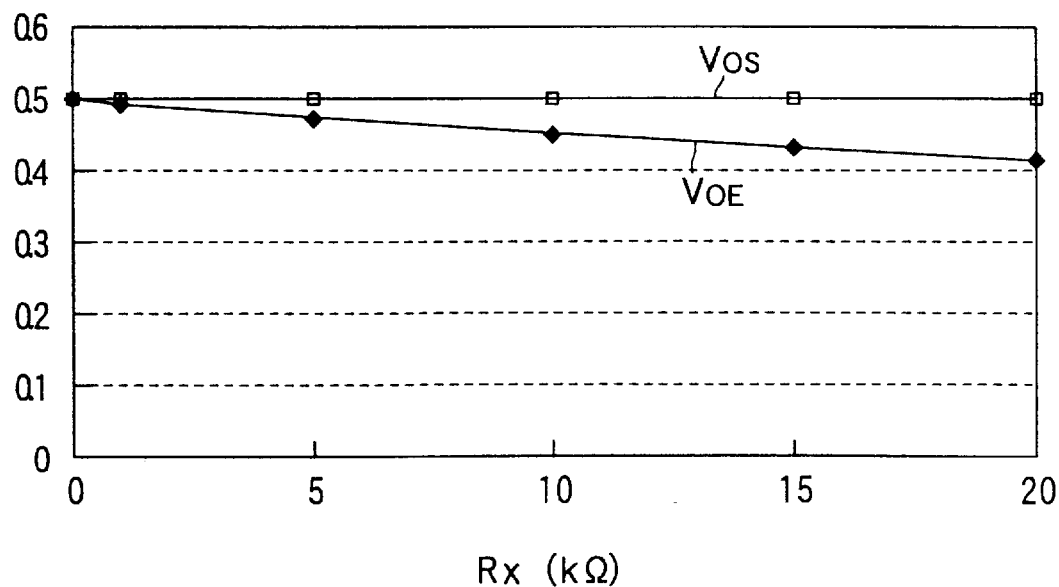
FIG. 11 is a diagram illustrating a characteristic of a sensor output from the pressure sensor apparatus shown in FIG. 10.

Hereinafter, a first embodiment in which the present invention is applied will be explained with reference to FIGS. 1 and 3. In this embodiment, a sensor apparatus is applied to a pressure sensor for measuring pressure such as brake fluid pressure in a vehicular brake device or fuel pressure in a fuel injection device. As shown in FIG. 1, the sensor apparatus of this embodiment is further provided with a switch 12 for switching power supply path to a sensor portion 20 and a diagnosis circuit (fault detecting means) 13 for detecting a fault based on the current Io in an output line $L_O$, compared to the sensor apparatus shown in FIG. 10.

The pressure sensor apparatus is provided with a control portion (ECU) 10 for controlling several controls and a sensor portion 20 for detecting applied pressure. The control portion 10 and the sensor portion 20 are electrically connected with each other via a power line $L_P$ for supplying power to the sensor portion 20; an output line $L_O$ for outputting an output signal from the sensor portion 20 to the control portion 10; and a ground line $L_G$. These lines are connected by using connector, soldering, or welding.

The sensor portion 20 is mounted on around a brake device or around fuel injection unit, and the control portion 10 is mounted in a case provided in an engine room or a passenger component. The power line $L_P$, the output line $L_O$ and the ground line $L_G$ are provided as external wirings which are provided in the engine room or the passenger component. Here, other wirings in the control portion 10 and the sensor portion 20 shown in FIGS. 1 and 2 include wirings on a print board, wirings on a semiconductor chip or wire bindings. Each line $L_P$, $L_O$, $L_G$ are connected with terminals P, O or G at the sensor portion 20 and terminals P, O or G at the control portion 10. In this and later embodiments, the power line Lp, the output line $L_O$ and the ground line $L_G$ are formed with the same condition each other.

The control portion 10 is provided with a regulator 11 for converting power supply voltage (e.g., 12 V) from a constant voltage power supply Vcc into a predetermined voltage (e.g., 5 V). After being converted by the regulator 11, the power supply voltage is supplied to the sensor portion 20 via the power line $L_P$. A load resistor RA for measuring an output voltage Vo from the sensor portion 20 is provided between the output line $L_O$ and the ground line $L_G$ in the control portion 10.

A switch (switching means) 12 is provided between the regulator 11 and the power line $L_P$. in the control portion 10. The switch 12 is normally switched to a side of the power line $L_P$, and is switched to a side of the output line $L_O$ at a time of the diagnosis.

A diagnosis circuit 13 is provided in the control portion 10. The diagnosis circuit 13 outputs a switch signal for switching the switch 12 to one of the power line $L_P$ and the output line $L_O$. The diagnosis circuit 13 periodically switches the switch 12 with using a timer or the like.

An ammeter 14 is provided on the output line $L_O$. The ammeter 14 measures the current Io which flows in the ground line $L_G$ from the output line $L_O$, when the power supply to the sensor portion 20 is switched to the side of the output line $L_O$. Since this ammeter 14 is used for detecting the current flowing the output line $L_O$ →a resistance R34 between the terminals O and G→the ground line $L_G$, the ammeter 14 may be provided on the ground line $L_G$. The diagnosis circuit 13 receives the current Io which is measured by the ammeter 14, and performs the diagnosis by comparing the measured current Io with a predetermined reference current value. In this embodiment, the measured current Io and the referent current are converted into the voltage value. Then, the diagnosis is performed by comparing these voltage values by using a window comparator etc.

As described in the above, the sensor portion 20 is connected with the control portion 10 via the power line $L_P$, the output line $L_O$ and the ground line $L_G$. The power is supplied to the sensor portion 20 via the power line $L_P$ and the sensor portion 20 outputs voltage signal (sensor signal) in response to the applied pressure from the output line $L_O$.

Figure 2:
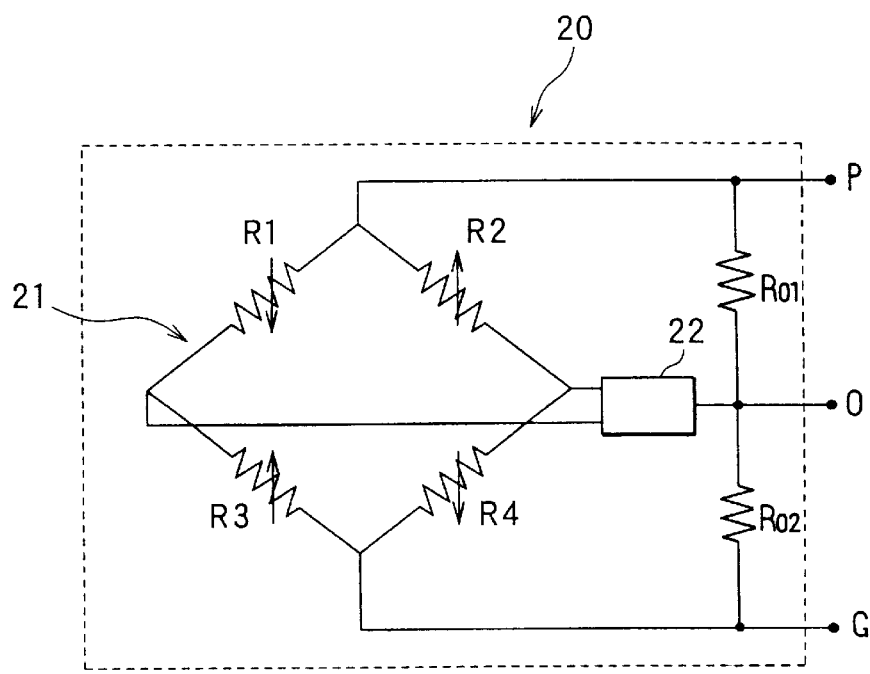
FIG. 2 is a schematic circuit configuration of a sensor portion of the sensor apparatus shown in FIG. 1.

The sensor portion 20 is provided with a bridge circuit 21 in which four gage resistors (diffusion resistors) R1–R4 are connected into a bridge connection, as shown in FIG. 2. The bridge circuit 21 is formed in a thin diaphragm portion provided in a silicon substrate (not shown). The resistors R1 and R4 of the bridge circuit 21 are formed at a center portion of the diaphragm portion, and the resistors R2 and R3 are formed at a peripheral potion of the diaphragm portion. When pressure is applied to the diaphragm portion, each resistance of the resistors R1–R4 is changed as indicated by arrows in FIG. 2 as a result of the piezoresistance effect. In detail, the resistances of the resistors R1 and R4 decrease, while the resistances of the resistors R2 and R3 increase. A difference between a potential of a middle (connecting) point between the resistors R1 and R4 and a potential of a middle (connecting) point between the resistors R2 and R3 is amplified by an amplifying and calibration circuit 22. The amplified potential difference is outputted to the control portion 10 via the output line $L_O$. Furthermore, output resistors Ro1 and Ro2 are respectively connected between the terminals P and O, and between the terminals O and G, to adjust the output from the bridge circuit. Here, the resistances R12 and R34 illustrated in FIG. 1 are combination resistances of the sensor portion 20 seen from the output terminal O of the sensor portion 20, and the combination resistances include the output resistors Ro1 and Ro2 and resistors R1–R4 connected to the output resistors Ro1 and Ro2.

Hereinafter, operation of the pressure sensor will be explained.

At first, a normal operation condition in which the pressure applied to the sensor portion 20 is measured will be explained. In the normal operation condition, the switch 12 is connected to the power line $L_P$ and the power is applied to the power line $L_P$. When the pressure is applied, the gage resistors R1–R4 in the sensor portion 20 change. The difference between potentials of two middle (connecting) points is amplified by an amplifying and calibration circuit 22. After that, the amplified potential difference is inputted to the control portion 10 via the output line $L_O$. The control portion 10 performs several controls based on the output signal from the sensor portion 20.

Next, a diagnosis operation in which the changes of the resistance due to the poor connection are measured will be explained. When the diagnosis is performed, the switch signal is outputted from the diagnosis circuit 13 to the switch 12. The switch 12 is switched to the output line $L_O$ of the sensor portion 20, and the power is applied to the output line $L_O$. The current flows from the output line $L_O$ to the ground line $L_G$ through the resistance R34 between the terminal O and G. In this case, although the current also flows in the load resistor RA, the current flowed in the load resistor RA can be ignored when the resistance R34 is set smaller than the resistance of the load resistor RA.

Under this condition, the current Io in the output line $L_O$ is measured by the ammeter 14, and the measured current Io is inputted to the diagnosis circuit 13. The diagnosis circuit 13 converts the measured current Io and the reference current value into the voltage values, and compares these voltage values. In this case, when the measured current Io excesses a diagnosis level (which is determined with respect to the reference current value in advance), the diagnosis circuit 13 judges that the fault occurs. After this judgment, the diagnosis circuit 13 outputs the fault signal, so that a fault informing process such as turning on a warning lamp is performed in response to the fault signal.

The reference current value can be determined with decreasing an influence of the deviation in manufacturing the pressure sensor, when an initial value of the current Io in the output line $L_O$ while the voltage is applied to the output line $L_O$ is stored in a memory circuit (not shown). Furthermore, the diagnosis level can be adequately determined, when the reference current value is determined to have some tolerance with considering the manufacturing deviation of the pressure sensor or a diagnosis request.

The diagnosis will be specifically explained. For example, when a voltage having 5 V is applied to the output line $L_O$, and when the resistance R34 in the sensor portion 20 has 1 kΩ, the current Io in the output line $L_O$ becomes Io=approximately 5 MA. This value, 5 mA, is determined as the reference current value. Here, it assumes that resistance of the output line $L_O$ increases by Rx (=1 kΩ) as a result of poor connection etc, the current Io in the output line $L_O$ becomes Io=2.5 mA. Since the output current Io is reduced to a half of the reference current value 5 mA, the fault can be easily detected. In this case, increase of resistance by 1 kΩ can be detected. Therefore, this embodiment has 66 times as good detection sensibility as the diagnosis level having 66 kΩ described in the above.

The diagnosis level of the output current Io can be adequately determined based on the diagnosis request. For example, the diagnosis level may be determined to a range of ±1 mA with respect to the reference current value of 5 mA, and the diagnosis circuit may detect the fault when the current Io from the output line excess a range of 5±1 mA.

Here, when the resistance R34 between the terminals O and G is modified by considering the manufacturing deviation of the pressure sensor with respect to the detection request of the poor connection, a diagnosis sensibility can be further improved. In detail, when the resistance 34 is set to small compared to the load resistor RA, the influence due to the load resistor RA can be decreased, and therefore it can detect the resistance increase even if the increment is smaller.

In this embodiment, the present invention is described with the case where the resistance increasing due to the poor connection at the connection portion, the present invention can be applied to other case such that the resistance decreasing due to a short-circuit of each terminals is detected. In detail, fault of connection such as the shorten-circuit of the output line $L_O$, the ground line $L_G$, or resistance R34 between the terminals O and G can be detected by measuring the current flowed from the output line $L_O$ to the ground line $L_G$ when the power is applied to the output line $L_O$.

Here, at the time of the diagnosis, the power is applied to the output line $L_O$ at a reverse direction against the normal operation. In this case, it can prevent the sensor from being damaged by providing cutoff circuit, designing adequately, or the like.

When the pressure is applied to the sensor portion 20, each of the resistors R1–R4 in the bridge circuit 21 are changed. Since the resistance changes due to applying pressure is much smaller than the resistance changes due to poor connection, the fault can be detected even if the pressure is being applied to the sensor portion 20. Furthermore, a cutoff circuit for canceling the influence of applying pressure may be provided in the sensor portion 20.

However the pressure sensor apparatus of this embodiment temporary stops the pressure detection during the diagnosis, it can be thought that each of the controls based on the measured pressure is not affected because the ECU processes with high speed compared to the switching of the switch 12.

Second Embodiment

Next, a second embodiment of the present invention will be explained with reference to FIG. 3. As shown in FIG. 3, in this embodiment, the switch (switching means) 12 of the first embodiment for switching one of the power line $L_P$ and the output line $L_O$ to which the voltage to the sensor portion 20 is applied is omitted. Furthermore, an ammeter 15 is provided on the power line $L_P$.

In the first embodiment, the fault is detected by measuring the current Io in the output line $L_P$ when the power is applied to the output line $L_O$. In the second embodiment, the fault is detected as follows. That is, the current Ip flowing from the power line $L_P$ to the ground line $L_G$ is measured while the power is applied to the power line $L_P$. The measured current Ip is compared with the predetermined reference current value after respectively converted into the voltage value. In this way, since the current flowed from the power line $L_P$ to the ground line $L_G$ is observed, it can detect the fault such as the poor connection in the power line $L_P$ or the ground line LG, or the short-circuit between each terminals of the resistances R12 and R34.

The diagnosis of the second embodiment may be performed with the diagnosis of the first embodiment. That is, in the pressure sensor apparatus of the first embodiment, the ammeter 15 for measuring the current Ip flowing in the power line $L_P$ is added. When the power is applied to the output line LO, the diagnosis is performed by using the current Io in the output line $L_O$. When the power is applied to the power line $L_P$, the diagnosis is performed by using the current Ip in the power line $L_P$.

Third Embodiment

Hereinafter, a third embodiment as a modification of the first embodiment will be explained with reference to FIGS. 4 and 5.

Figure 4:
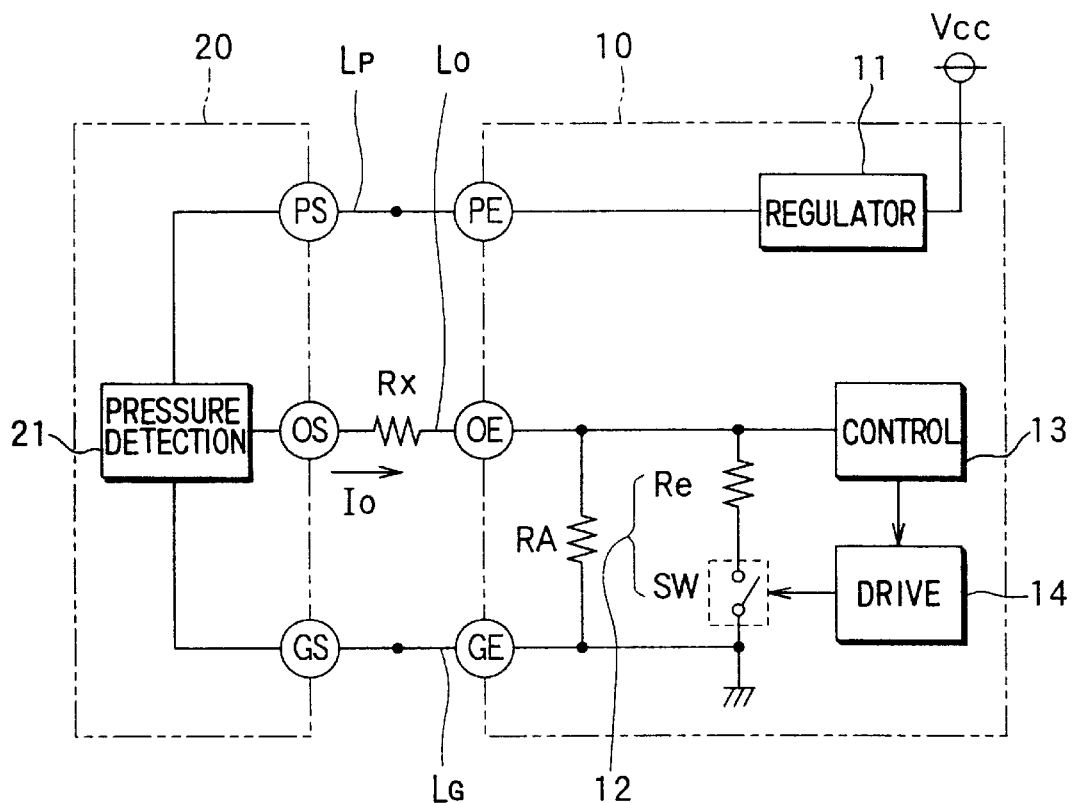
FIG. 4 is a schematic circuit configuration of a pressure sensor apparatus of a third embodiment according to the present invention.
Figure 5:
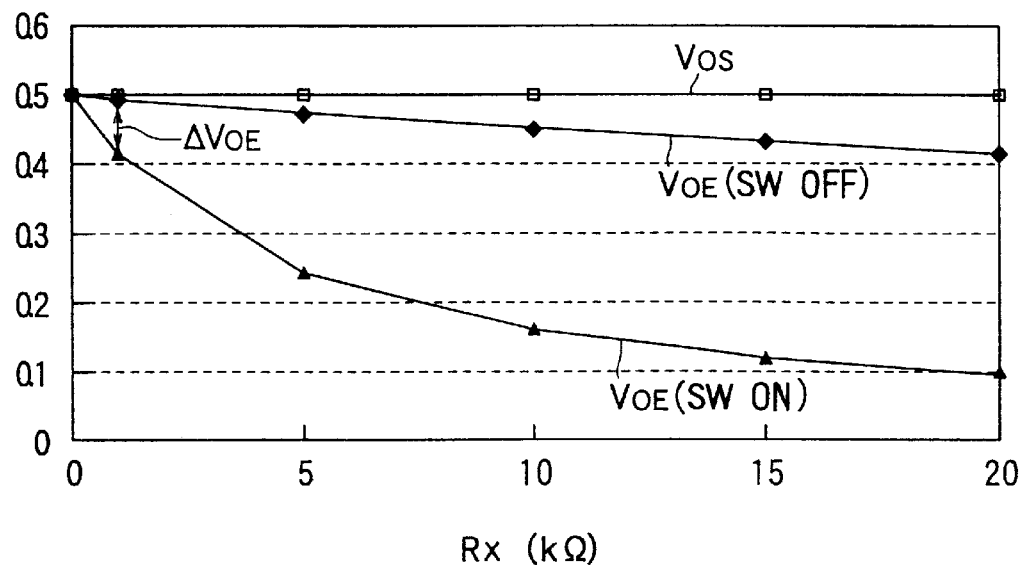
FIG. 5 is a diagram illustrating a characteristic of a sensor output from the pressure sensor apparatus shown in FIG. 4.

As shown in FIG. 4, in the sensor apparatus of this embodiment, a diagnosis circuit 12, which is made up of a diagnosis resistor Re and a switch (switching means) SW serially connected the diagnosis resistor Re, is connected in parallel with a load resistor RA in the control portion 10.

The pressure sensor apparatus is provided with a control portion (ECU) 10 for controlling several controls and a sensor portion 20 for detecting applied pressure. The control portion 10 and the sensor portion 20 are electrically connected with each other via a power line $L_P$ for supplying power to the sensor portion 20; an output line $L_O$ for outputting an output signal from the sensor portion 20 to the control portion 10; and a ground line $L_G$. These lines are connected by using connector, soldering, or welding. Each line $L_P$, $L_O$, $L_G$ is connected with terminals PS, OS or GS at the sensor portion 20 and terminals PE, OE, GE, PS, OS, and GS at the control portion 10.

The control portion 10 is provided with a regulator 11 for converting power supply voltage (e.g., 12 V) outputting from a constant voltage power supply Vcc into a predetermined voltage (e.g., 5 V). After being converted by the regulator 11, the power supply voltage is supplied to the sensor portion 20 via the power line $L_P$.

The control portion 10 is provided with a load resistor RA between the output line $L_O$ and the ground line $L_G$, so that the sensor output (normally within a range of 0.5 V–4.5 V) is positively changed to a fault signal (outside of the normal range, e.g., 4.8 V or more, or 0.2 V or less) when a short-circuit or a cut-off occurs on the lines $L_P$, $L_O$ and $L_G$. Furthermore, the diagnosis circuit 12, which is made up of a diagnosis resistor Re and a switch (switching means) SW serially connected the diagnosis resistor Re, is connected in parallel with a load resistor RA in the control portion 10. A transistor etc may be used as the switch SW. The diagnosis circuit 12 is for changing the current Io flowing in the output line $L_O$ by turning on or off the switch SW.

A control circuit 13 is provided in the control portion 10. The control circuit 13 controls the turning on or off of the switch SW via a drive circuit 14. A difference $\Delta V_{OE}$ between a potential $V_{OE}$ at the terminal OE when the switch is turned on and that when the switch is tuned off is detected. The control circuit performs the diagnosis by comparing the difference $\Delta V_{OE}$ with the predetermined reference value (threshold value). Here, the diagnosis may be performed by software and may be performed by using hardware such as a logic circuit.

As described in the above, the sensor portion 20 is connected with the control portion 10 via the power line $L_P$, the output line $L_O$ and the ground line $L_G$. The power is supplied to the sensor portion 20 via the power line $L_P$ and the sensor portion 20 outputs voltage signal (sensor signal) in response to the applied pressure from the output line $L_O$.

The sensor portion 20 is provided with a pressure detection circuit 21. The pressure detection circuit 21 has a Wheatstone bridge circuit and an amplifying and adjusting circuit. The bridge circuit is formed on a thin diaphragm portion of a silicon substrate (not shown). When the pressure is applied to the diaphragm portion, each resistance of the resistors is changed as a result of the piezoresistance effect, and the bridge circuit outputs electric signal in proportion to the applied pressure. The pressure detection circuit 21 amplifies the signal from the bridge circuit by using the amplifying and adjusting circuit, and then outputs the amplified signal to the control portion 10 via the output line $L_O$.

Hereinafter, the operation of the pressure sensor will be explained.

At first, a normal operation condition in which the pressure applied to the sensor portion 20 is measured will be explained. In the normal operation condition, the power is applied to the sensor portion 20 via the power line $L_O$. After performing the processes such as pressure detection or amplifying, the pressure detection circuit 21 outputs the sensor outputs $V_{OS}$ (the potential of the terminal OS of the sensor portion, connected to the output line $L_O$) to the control portion 10 via the output line $L_O$. The control portion 10 performs several controls based on the sensor output $V_{OE}$(the potential of the terminal OE of the sensor portion, connected to the output line $L_O$) having received from the sensor portion 20 via the output line $L_O$.

Next, a diagnosis operation in which the changes of the resistance due to the poor connection are measured will be explained. As described in the above, when the current Io flows in output line $L_O$ and a contact resistance Rx is added to the output line $L_O$, and when the sensor portion 20 outputs the sensor signal $V_{OS}$ to the output line $L_O$, the sensor signal $V_{OE}$ to be received by the control portion 10 is represented by the following equation (1).

$$V_{OE}=V_{OS}-(R_x \times Io) \qquad (1)$$

Here, when no contact resistance Rx is added to the output line $L_O$, since the $V_{OE}$ has no change, $V_{OE}=V_{OS}$. In other words, the sensor output $V_{OE}$ at the control portion 10 is equal to the sensor output $V_{OS}$ at the sensor portion 20. Therefore, even when the switch SW is being off and the current flows only in the load resistor RA, or even when the switch SW is being on and the current flows in both the load resistor RA and the diagnosis circuit 12, $V_{OE}$ is equal to $V_{OS}$ (this relationship is not changed).

On the contrary, in the case where the contact resistance Rx is added to the output line $L_O$, when the switch is being off, no current flows in the diagnosis circuit 12. In this case, the sensor output $V_{OE}$ at the control portion 10 is resistance-divided by the contact resistance Rx and the load resistor RA. The sensor output $V_{OE}$ in this case is represented by the following equation (2).

$$V_{OE}=V_{OS} \times RA/(RA+Rx) \qquad (2)$$

When the switch SW is turned on in response to the signal from the control circuit 13, current starts to flow in the diagnosis circuit 12. In this case, the load resistor RA in the above equation is replaced by a combination resistance RA' which is a combination of the load resistor RA and the diagnosis resistor Re. Therefore, the sensor output $V_{OE}$ in this case is represented by the following equation (3)

$$V_{OE}=V_{OS} \times RA'/(RA'+Rx) \tag{3}$$

Here, the combination resistance RA' is represented by the following equation (4).

$$RA'=1/(1/RA+1/Re) \tag{4}$$

In detail, for example, it assumes that the output $V_{OS}$ from the sensor portion 20 is 0.5 V, the resistance of the load resistor RA is 500 kΩ, and the resistance of the diagnosis resistor is 5 kΩ. Here, it assumes that the resistance of the output line LO increases the resistance of the contact resistance Rx having 1 kΩ due to the power connection. When the switch SW is off, the sensor output $V_{OE}$ is calculated by $V_{OE}=V_{OS} \times 500$ kΩ/(500 kΩ+1 kΩ)≈0.5 V. On the contrary, when the switch is on, the combination resistance RA' is calculated by RA'=1/(1/500 kΩ+1/5 kΩ)≈5 kΩ, and the sensor output $V_{OE}$ is calculated by $V_{OE}=V_{OS} \times 5$ kΩ/(5 kΩ+1 kΩ)≈0.42 V. In this case, the difference $\Delta V_{OE}$ is 0.08 V.

When the output VOS from the sensor portion 20 is 0.5 V, the load resistor RA has 500 kΩ and the diagnosis resistor Re has 5 kΩ, the $V_{OE}$ while the switch is on or off is changed in response to the resistance Rx added to the output line $L_O$ as shown in FIG. 2. In detail, when the switch is on, the load resistor RA becomes more smaller combination resistance RA'. As a result, the influence of the Rx to the $V_{OE}$ is enhanced, and the $V_{OE}$ can be largely reduced compared to that when the switch is off.

In other words, when the load resistor RA is changed to the small combination resistor RA' as a result of switch SW being turned on, since the current Io flowing in the resistance Rx increases, (Rx×Io) in the right term of the equation (1) increases. As a result, the $V_{OE}$ can be largely reduced compared to the case when the switch SW is off.

Therefore, the control portion 10 observes the $\Delta V_{OE}$ which is the difference of the $V_{OE}$ when the switch is on and when it is off in the control circuit 13. When the $\Delta V_{OE}$ exceeds predetermined reference value (threshold value), the fault such as the resistance addition to the output line $L_O$ can be detected. The reference value can be adequately determined based on the resistance Rx to be detected.

In this pressure sensor apparatus, when the diagnosis circuit detects the fault, a fault signal is outputted to the control circuit 13. The control circuit 13 performs predetermined alarming process such as turning on the warning lamp.

Here, when the diagnosis resistance Re is adequately determined by taking the manufacturing deviation of the pressure sensor into consideration for detection request of the poor resistance, sensibility of the diagnosis can be further improved. In detail, far smaller resistance increasing in the output line $L_O$ can be detected when the resistance of the diagnosis resistor Re is set small compared to the load resistor RA.

Fourth Embodiment

Next, a pressure sensor apparatus of a fourth embodiment will be explained with reference to FIGS. 6 and 7. In the third embodiment, the load resistor RA is connected between the output line $L_O$ and the ground line $L_G$. On the contrary, in the fourth embodiment, the load resistor RA is connected between the power supply line $L_P$ and the output line $L_O$.

The pressure sensor apparatus having such a structure can also detect the fault such as the resistance addition to the output line $L_O$ as a result of the poor connection etc, by providing the diagnosis circuit 12 in parallel with the load resistor RA similar to the third embodiment.

Figure 6:
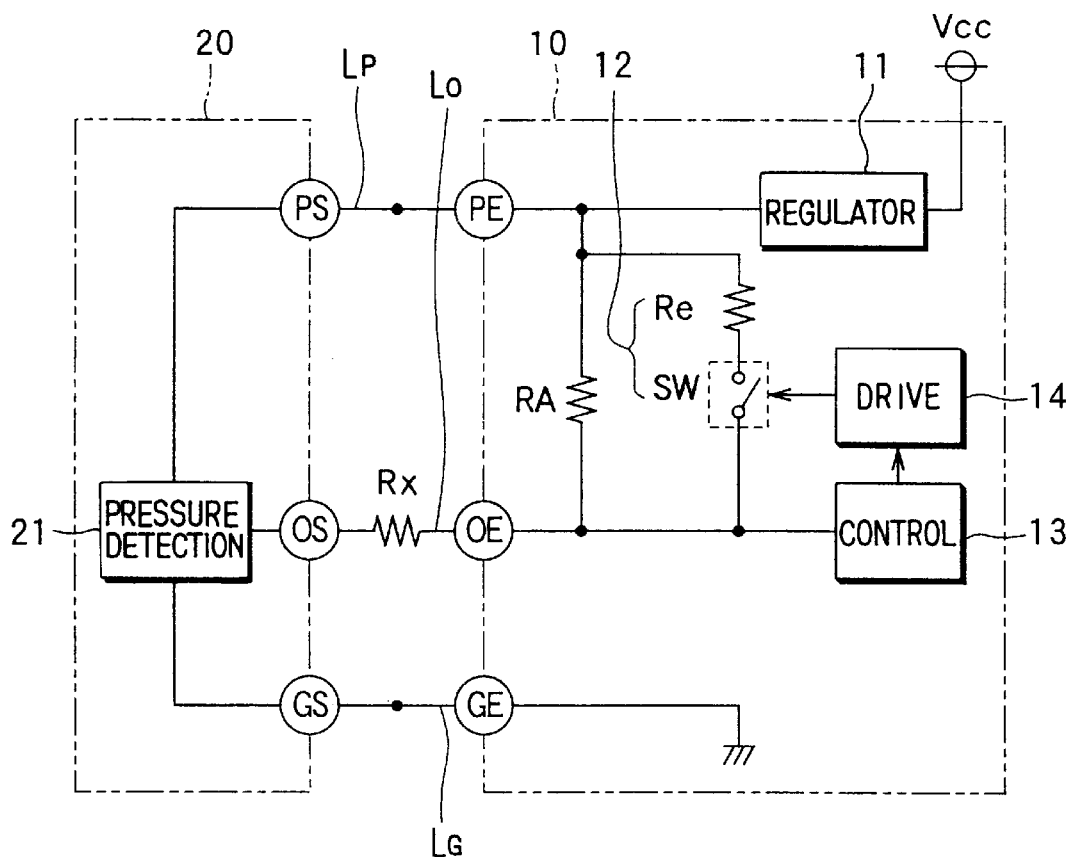
FIG. 6 is a schematic circuit configuration of a pressure sensor apparatus of a fourth embodiment according to the present invention.

According to the pressure sensor apparatus shown in FIG. 6, the sensor output $V_{OE}$ at the side of the control portion 10 when the switch SW is off is represented by the following equation (5).

$$V_{OE}=V_{OS}+(V_{PS}-V_{OS}) \times Rx/(RA+Rx) \tag{5}$$

Furthermore, when the switch SW is on, similar to the third embodiment, the load resistor RA in the above equation is replaced by a combination resistance RA' (=1/(1/RA+1/Re)) which is a combination of the load resistor RA and the diagnosis resistor Re.

Figure 7:
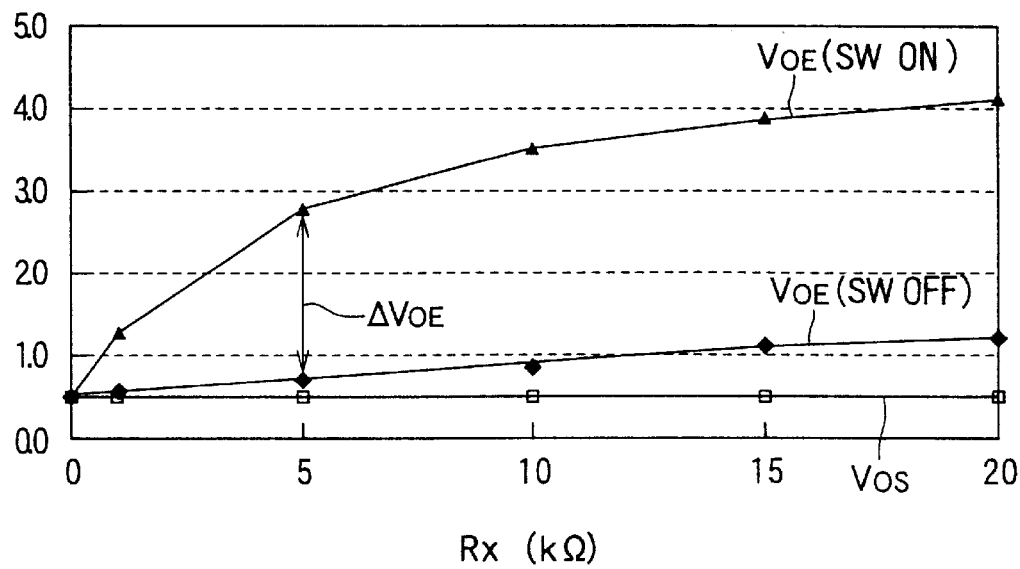
FIG. 7 is a diagram illustrating a characteristic of a sensor output from the pressure sensor apparatus shown in FIG. 6.

According to the pressure sensor apparatus of this embodiment, when the output $V_{OS}$ from the sensor portion 20 is 0.5 V, the resistance of the load resistor RA is 500 kΩ, and the resistance of the diagnosis resistor is 5 kΩ, the $V_{OE}$ while the switch is on or off is changed as shown in FIG. 7, in response to the resistance Rx added to the output line $L_O$.

Therefore, similar to the third embodiment, the fault such as the resistance addition to the output line $L_O$ can be detected, by observing the $\Delta V_{OE}$ which is the difference of the $V_{OE}$ when the switch is on and when it is off in the control portion 10.

Modifications

In the first and the second embodiments, the measured current and the reference current value are converted into the voltage values, and then they are compared with each other as the voltage value. However, the measured current and the reference current value may be directly compared with each other as the current value.

In this first embodiment, the switch 12 is provided in the control portion 10. However, the switch 12 may be provided to the sensor portion 20.

Figure 8A:
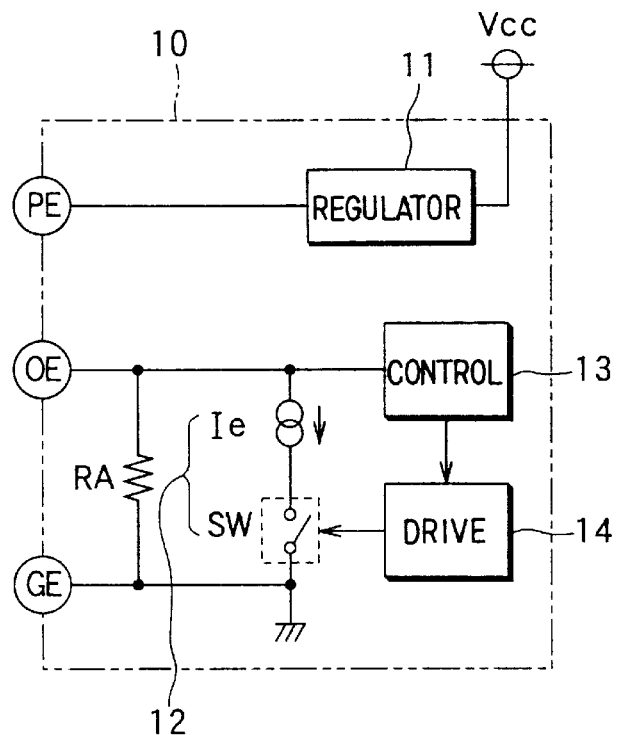
FIGS. 8A, 8B, 9A and 9B are schematic circuit configurations of a pressure sensor apparatus of modified embodiments.
Figure 8B:
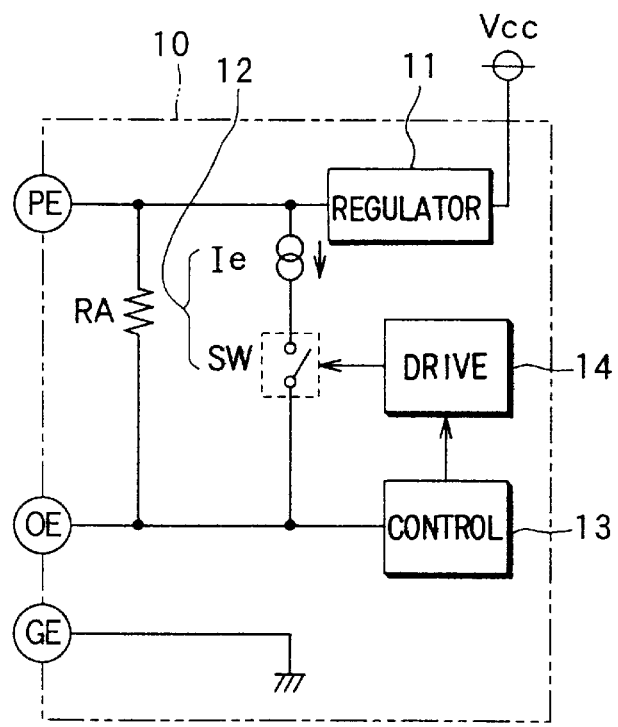

Furthermore, in the third and the fourth embodiments, the diagnosis circuit 12 is made up of the diagnosis resistor Re and the switch SW which are connected in parallel to the load resistor RA. However, as shown in FIGS. 8A and 8B, a constant current source Ie may be used instead of the diagnosis resistor Re. In this case, since the current is forcefully flowed as a result of switch SW turning on, the Io in the equation (1) can be increased. Hence, the potential $V_{OE}$ of the output line $L_O$ at the terminal OE of the control portion can be decreased. Therefore, similar to the proceeding embodiment, the fault such as the resistance addition to the output line $L_O$ can be detected, by observing the $\Delta V_{OE}$ which is the difference of the $V_{OE}$ when the switch is on and when it is off in the control portion 10.

Figure 9A:
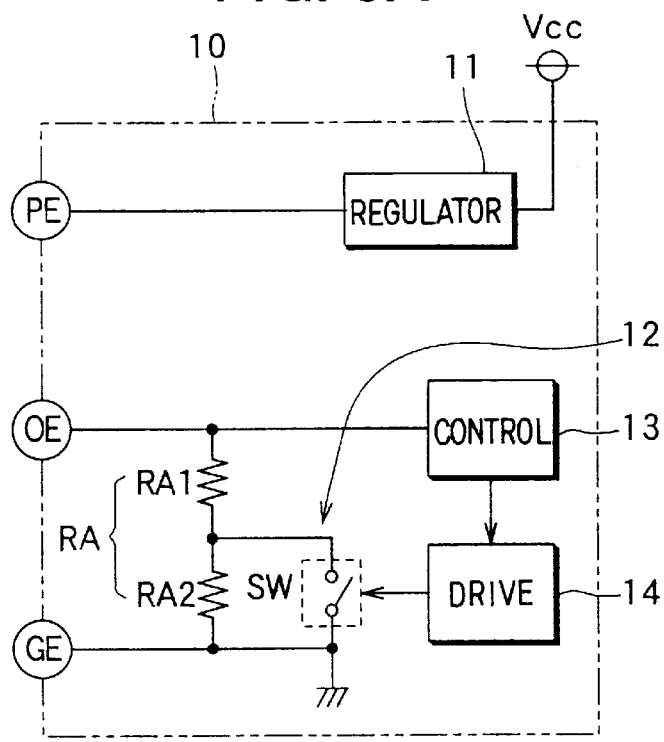
Figure 9B:
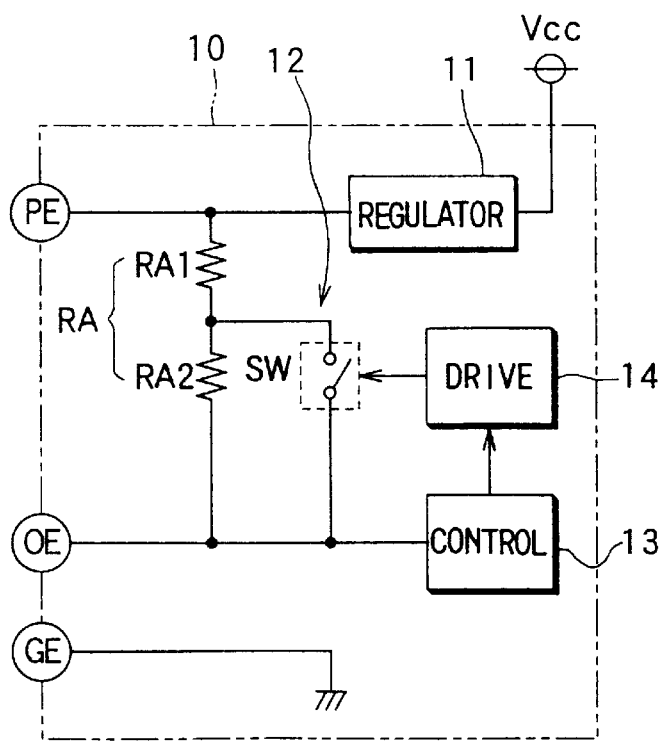

Furthermore, as shown in FIGS. 9A and 9B, the load resistor RA may be formed by plural (e.g., two) resistors RA1 and RA2; and the diagnosis circuit 12 may bypass one of the plural resistors by using a switch SW. In this case, when the switch is turned on, the total resistance of the whole load resistor RA decreases; the current Io in the output line $L_O$ increases; and the potential $V_{OE}$ of the output line $L_O$ at the terminal OE of the control portion can be decreased. Therefore, the fault such as the resistance addition to the output line $L_O$ can be detected, by observing the $\Delta V_{OE}$ which is the difference of the $V_{OE}$ when the switch is on and when it is off in the control portion 10.

As described in the above, the diagnosis circuit 12 is not limited to the above described embodiments. That is, the diagnosis circuit 12 can be modified as long as the potential $V_{OE}$ of the output line $L_O$ at the terminal OE can be changed when the resistor Rx in the output line $L_O$ is increased when the current Io flowing in the output line $L_O$ is changed In the above embodiments, the sensor portion is formed by the bridge circuit made up of gage resistors. However, there are other ways for the sensor portion. For example, capacitive sensor etc may be used.

In the above embodiments, the present invention is applied to the pressure detection apparatus for detecting several kind of pressure. However, the present invention can be applied to other sensors such as acceleration sensor, yaw rate sensor etc as long as it includes the power supply line, the output line and the ground line.

What is claimed is:

1. A sensor apparatus comprising:

a sensor portion for outputting a sensor signal;

a control portion electrically connected to the sensor portion via a power supply line, an output line and a ground line, the control portion performing several controls based on the sensor signal received from the sensor portion via the output line;

an output current changing portion for changing current flowing in the output line; and a diagnosis portion for detecting a difference between the sensor signal before changing the current and the sensor signal after changing the current, and the diagnosis portion detecting an occurrence of fault based on the difference in the sensor signal.

2. A sensor apparatus according to claim 1, wherein:

a load resistor is provided between the output line and the ground line in the control portion, and the output current changing portion changes a resistance between the output line and the ground line in the control portion, the resistance includes a resistance of the load resistor.

3. A sensor apparatus according to claim 2, wherein:

the output current changing portion includes a diagnosis resistor and a switching device, and the output current changing portion is a diagnosis circuit connected in parallel with the load resistor, and the diagnosis portion detects the occurrence of fault based on the difference between the sensor signal when the switching device is on and the sensor signal when the switching device is off.

4. A sensor apparatus according to claim 2, wherein:

the output current changing portion includes a constant current source and a switching device, and the output current changing portion is a diagnosis circuit connected in parallel with the load resistor, and the diagnosis portion detects the occurrence of fault based on the difference between the sensor signal when the switching device is on and the sensor signal when the switching device is off.

5. A sensor apparatus comprising:

a sensor portion for outputting a sensor signal;

a control portion electrically connected to the sensor portion via a power supply line, an output line and a ground line, the control portion performing several controls based on the sensor signal received from the sensor portion via the output line;

an output current changing portion for changing current flowing in the output line;

a diagnosis portion for detecting a difference between the sensor signal before changing the current and the sensor signal after changing the current, and the diagnosis portion detecting an occurrence of fault based on the difference in the sensor signal;

a load resistor provided between the power supply line and the output line in the control portion, wherein the output current changing portion changes a resistance between the power supply line and the output line in the control portion, and the resistance includes a resistance of the load resistor.

6. A sensor apparatus according to claim 5, wherein:

the output current changing portion includes a diagnosis resistor and a switching device, and the output current changing portion is a diagnosis circuit connected in parallel with the load resistor, and the diagnosis portion detects the occurrence of fault based on the difference between the sensor signal when the switching device is on and the sensor signal when the switching device is off.

7. A sensor apparatus according to claim 5, wherein:

the output current changing portion includes a constant current source and a switching device, and the output current changing portion is a diagnosis circuit connected in parallel with the load resistor, and the diagnosis portion detects the occurrence of fault based on the difference between the sensor signal when the switching device is on and the sensor signal when the switching device is off.

8. A sensor apparatus comprising:

a sensor portion for sensing physical quantity and for outputting a sensor signal depending on the physical quantity;

a control portion electrically connected to the sensor portion, for supplying power to the sensor portion and for processing the sensor signal outputted from the sensor portion;

external wires for connecting the sensor portion and the control portion, for supplying power from the control portion to the sensor portion, and for transmitting the sensor signal from the sensor portion to the control portion; and a diagnosis portion for measuring a value based on current flowing in one of the external wires to detect a resistance of a circuit including the one of the external wirings in which the current flows, the diagnosis portion further for detecting a fault of the circuit by processing measured value, the diagnosis portion outputting a diagnosis signal including a switch that causes a change in a current path where the current flows.

9. A sensor apparatus according to claim 8, wherein the switch amplifies change in the resistance of the circuit when turned on.

10. A sensor apparatus according to claim 9, wherein the switch makes another current path when turned on.

11. A sensor apparatus comprising:

a sensor portion for outputting a sensor signal;

a control portion electrically connected to the sensor portion via a power supply line, an output line and a ground line, the control portion performing several controls based on the sensor signal received from the sensor portion via the output line;

an output current changing portion for changing current flowing in the output line; and a diagnosis portion for detecting a difference between the sensor signal before changing the current and the sensor signal after changing the current, the diagnosis portion detecting an occurrence of fault based on the difference in the sensor signal, and the diagnosis portion outputting a diagnosis signal, wherein the output current changing portion changes the current when activated by the diagnosis portion.

12. The sensor apparatus of claim 11, wherein the diagnosis signal outputted by the diagnosis portion indicates fault when the difference is outside of a specific tolerance range.

13. The sensor apparatus of claim 11, wherein the diagnosis signal outputted by the diagnosis portion indicates fault when the difference exceeds a predetermined reference value.

14. The sensor apparatus of claim 11, wherein the diagnosis portion includes a diagnosis resistor and a switch that are both connected in parallel to a load resistor.

* * * * *